United States Patent [19]

Bläsing et al.

[11] Patent Number: 4,776,939
[45] Date of Patent: Oct. 11, 1988

[54] DEVICE FOR THE ELECTROPLATING TREATMENT OF PLATE-SHAPED OBJECTS

[75] Inventors: Horst Bläsing, Berlin; Thomas Kosikowski, Nürnberg; Ludwig Mankut, Altdorf; Walter Meyer, Berlin, all of Fed. Rep. of Germany

[73] Assignee: Schering Aktiengesellschaft, Berlin and Bergkamen, Fed. Rep. of Germany

[21] Appl. No.: 75,118

[22] Filed: Jul. 20, 1987

[30] Foreign Application Priority Data

Jul. 19, 1986 [DE] Fed. Rep. of Germany ....... 3624481

[51] Int. Cl.⁴ .............................................. C25D 17/00
[52] U.S. Cl. .................................................... 204/202
[58] Field of Search .............................. 204/198, 202

[56] References Cited

U.S. PATENT DOCUMENTS 4,405,431 9/1983 Pfeifer ................................ 204/202

Primary Examiner—T. M. Tufariello
Attorney, Agent, or Firm—Michael J. Striker

[57] ABSTRACT

A device for electroplating electric circuit boards includes an electroplating bath and a plurality of transporting organs which hold objects to be treated when they path the electroplating bath. The transporting organs are pairs of clamping yokes arranged on a common endless rotating belt and positionable from a clamping position in which they engage the object being treated and a release position in which they release said object.

13 Claims, 2 Drawing Sheets

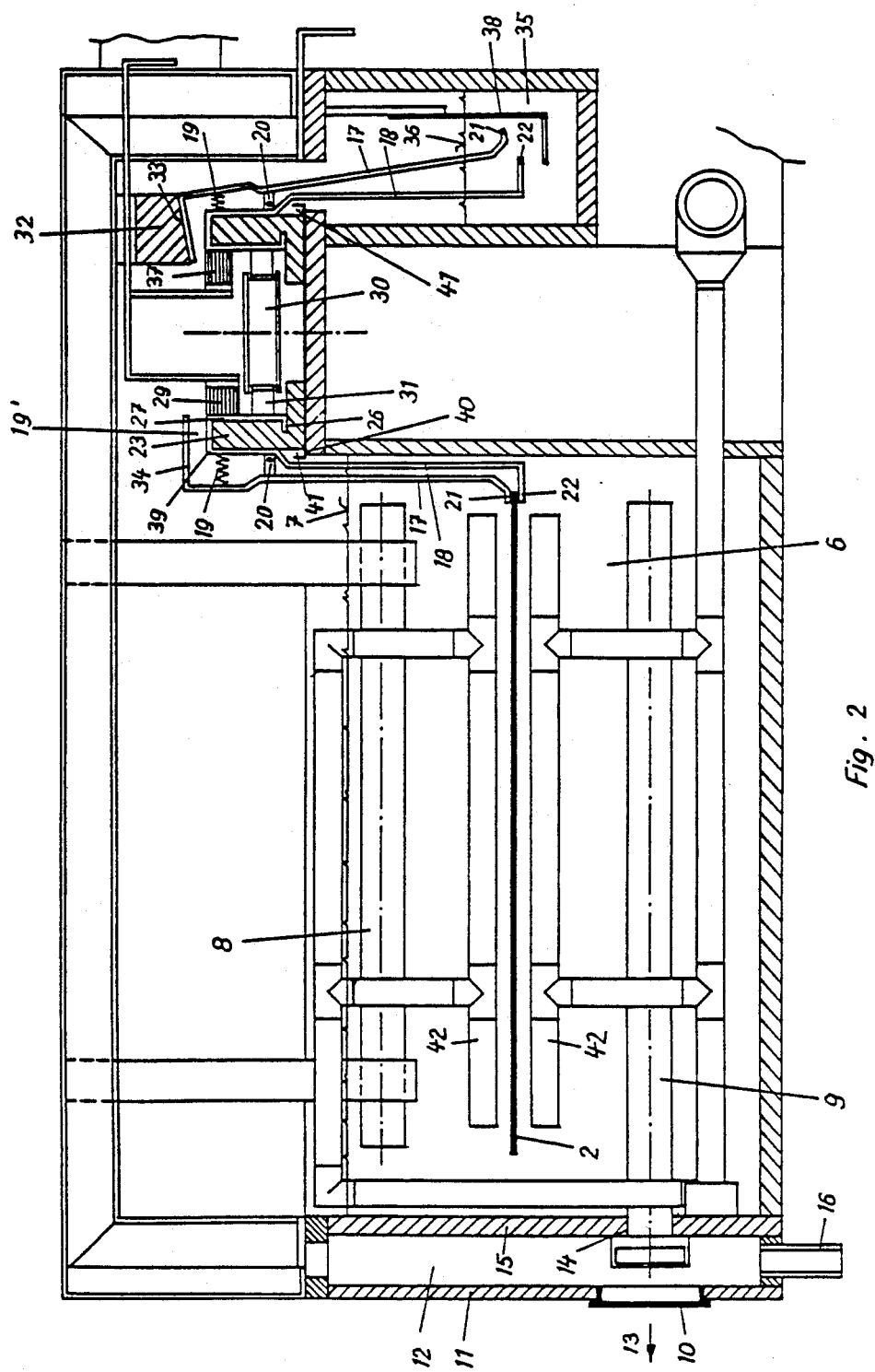

DEVICE FOR THE ELECTROPLATING TREATMENT OF PLATE-SHAPED OBJECTS

BACKGROUND OF THE INVENTION

The present invention relates to a device for electroplating plate-shaped objects.

Known devices of the type under discussion include an electroplating bath and means for transporting the objects to be electroplated through the bath. Such known devices are particularly suitable for electroplating with copper. One of the devices of the type under consideration has been disclosed in DE-OS No. 32 36565. The advantage of this conventional device resides in that plate-shaped objects are continually conveyed through the electrolytic chamber from the pretreatment stations in their horizontal position, and these objects remain in the horizontal position until they are fed to the after-treatment station. At this known device, however, the transportation of plate-shaped objects is troublesome and therefore disadvantageous. The plate-shaped objects are engaged, during the electroplating process, at their edges at two sides by rollers or wheels. The rollers or wheels provided at one side must be supported in slotted guides against the spring force. This known structure is extremely bothersome and, due to its complexity, is not only expensive but also disturbing. The front edges of the rollers or wheels are meander-shaped to enble a current transmission. There is also a danger with this conventional device that upon the release of the contact place and yet-non-complete application of the following contact plate of the rollers or wheels, electric arcs may form on the edges of the plates. Since the front edges and peripheral edges of the rollers or wheels should be continually moved along the edges of the plates they are used for a relatively short time. The material being deposited onto the plate-shaped objects during the electroplating process is also transmitted to the rollers or wheels. These rollers must be removed for the removal of the deposited material cleaned and again mounted in the device. This leads not only to excessive assembling expenses but also to undesirable interruptions of the operation. Furthermore, each roller or wheel requires its own drive.

SUMMARY OF THE INVENTION

It is an object of the present invention to provide an improved device for electroplating plate-shaped objects, particularly circuit boards.

These and other objects of the invention are attained by a device for the electrolytic deposition of a metal onto plate-shaped objects such as circuit boards, comprising an electroplating bath filled with electrolytic liquid and admitting said objects for a certain period of time, said bath having an electroplating chamber to which the objects are continually fed in a horizontal position and from which they are discharged after an electrolytic treatment; anodes positioned in said chamber; means for applying current to said objects which serves as cathodes; and means for transporting said objects, said transporting means including a plurality of transporting organs positioned in an endless driven row one after another, said transporting organs firmly holding side edges of the plate-shaped objects and moving in a transport direction over a transport path which is defined at a beginning and at an end of said chamber; and means effecting an engagement of said plate-shaped objects by said transporting organs or a release of said objects from said transporting organs.

The endless rotating transporting means engage the edges of the plate-shaped objects, particularly in the electro-plating process of circuit boards utilized in electronics. Therefore, there is no relative movement between the transport organs and the objects being treated before the beginning of the engagement or before the beginning of the release. The wear and noise from the transport organs are therefore avoided. After the passing of the transport area inside the electroplating chamber, the transport organs are automatically released from the plate edges and are fed back from the outside of the chamber until the starting end of the transport region at which the transport organs again engage the edges of the plate-shaped object. This simplifies the drive of the transport organs. Due to the invention each individual transport organ should not be provided with its own drive; instead a common drive for all transport organs is provided so that a simple and robust arrangement is made possible.

The transporting organs may be clamps which releasably engage the edges of said objects over said transport path in said chamber.

Each clamp may include two yokes biased by springs support therebetween, said springs exerting on said yokes a clamping force to place them in a clamping position in which they seize an edge of an object being treated, said effecting means including a rail having an onset surface which acts on at least one of said yokes so as to bring said one yoke in a non-transporting region to a release position. The yokes provide a very strong clamping action whereby by the aforementioned rail the yokes can be easily placed to the position in which the yokes engage the object or to the position in which the yokes release the object being treated.

A guide rail may be provided for guiding said yokes, said guide rail being endless and rotatable so as to rotate the pairs of yokes from the position in the electroplating bath to the position outside the electroplating bath, in which the yokes release the objects being treated by the aforementioned rail with the onset furface.

The transporting means may further include at least one endless rotating belt, said yokes in pairs being positioned on said belt at intervals from each other. The belt forms a common drive for a plurality of transport organs.

A compression spring may be provided for each yoke, each yoke being pivotable about a pivot connection and has an arm overlapping a respective spring which is positioned above a respective pivot connection and below said arm.

The current supply means may be provided on said transport organs whereby current supply to the objects being treated which form the cathodes in the electroplating bath, is substantially improved.

The current supply means may include a stationary wiper arrangement which lies on said yokes in the region of said transport path.

The device may further include an additional bath chamber filled with electrolytic liquid and positioned outside said transport path, and an additional stationary wiper arrangement applied to said yokes so as a current supplied to said yokes is of a polarity opposite to that of the yokes positioned in said transport path and applied by said wiper arrangement which lies on said yokes in the region of said transport path so as to demetallize the ends of said yokes. Thus the demetallization of the yokes covered with deposits from the electroplating process takes place outside the electroplating bath.

The additional bath is filled with the electrolytic liquid which upon the transfer from or to said electroplating bath is applied to passing locations of said yokes to demetallize them.

The transporting means and current supply means may be provided at at least one longitudinal side of each object to be treated.

The drive means for moving said transport organs may be positioned laterally outside of each of said baths.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 2 is a sectional view taken along line II—II but of the modified embodiment of the invention.

DETAILED DESCRIPTION OF THE PREFERRED EMBODIMENTS

Figure 1:
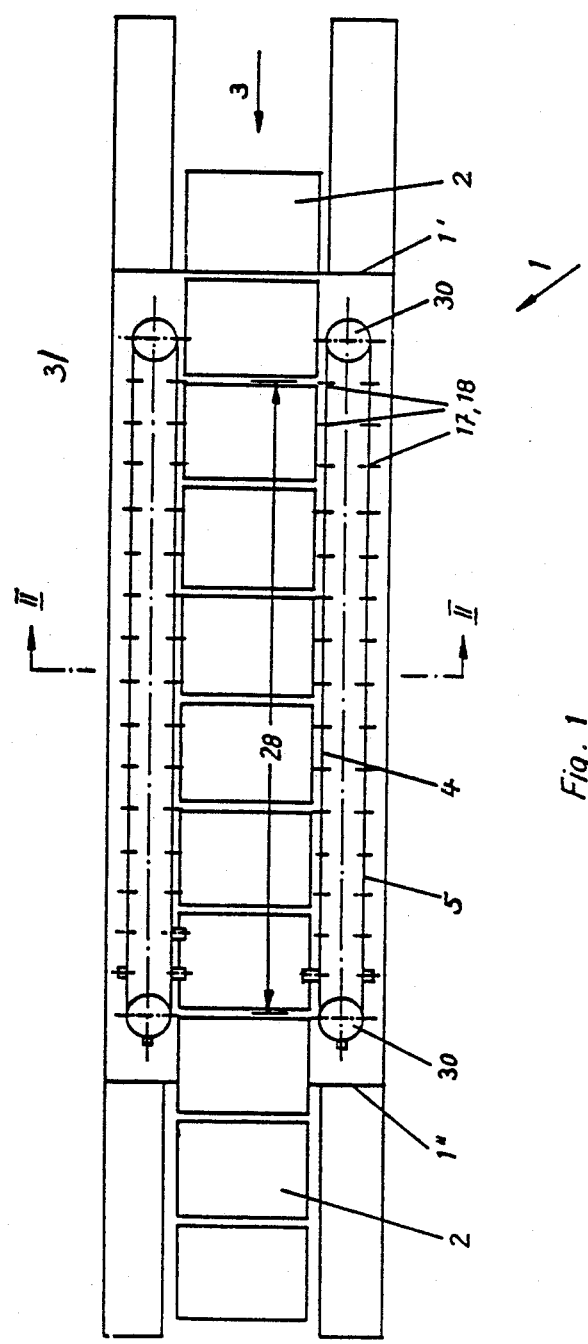
FIG. 1 is a schematic view of the device according to the invention.

Referring now to the drawings in detail, FIG. 1 schematically shows the front view of the device for the electrolytic treatment of plate-shaped objects of the invention while FIG. 2 illustrates a sectional view through FIG. 1 on an enlarged scale. Reference numeral 1 designates an electrolytic chamber into which plate-shaped objects 2 are fed in the direction of arrow 3 by a non-shown herein transport device from one or many pre-treatment stations which are conventional and not shown in the drawings. The plate-shaped objects 2 enter the electrolytic chamber 1 at the side 1' thereof, then run through this chamber and are discharged from the latter at the side 1" opposite to side 1'.

Referring to FIG. 2, it will be seen that inside chamber 1, is positioned an electrolytic bath 6. The upper surface 7 of the bath 6 is located above upper anodes 8 which in turn are positioned above the plate-shaped objects 2 or their transporting path. Lower anodes 9 are positioned below the plate-shaped objects 2 treated in the electrolytic bath. Anodes 8 and 9 can be formed as plates of the material being deposited on objects 2, for example copper. However, containers can be provided, made of the material other than that being deposited on the objects being treated, for example titan, which container would contain the metal being deposited in the bath. The upper anodes 8 can be lifted upwardly to be replaced with new ones. The lower anodes 9, after the removal of a sealing cover 10, and shutting off the device and after the electrolytic material volumes has been drained away from chamber 1 into a collecting container from which one pump or a number of pumps will again feed the electrolyte when the operation starts, can be pulled in the direction of arrow 13 into an auxiliary chamber 12 provided at the side wall 11. The lower anodes 9 thus will pass through a bore 14 in the chamber wall 15. The electrolytic liquid is collected in the auxiliary chamber 12 and is pumped back via a discharge opening 16 of the pump and returned into the container and to the electrolytic bath 6.

Current supply conduits to the stationary anodes 8 and 9 are not shown in the drawings. During operation the current supply means or conduits, during operation, are also connected to the plate-shaped objects which form in the known fashion, the cathodes in the electrolysis process which are moved by the transporting means. The transporting means in the exemplified embodiment is formed as follows:

The transport means includes clamps which each includes in this embodiment two yokes 17 and 18 which are acted upon by the pressure of springs 19, and are pivoted at their hinge and current-conductive connections 20 so that their lower ends 21 and 22 are pressed relative to each other by the spring pressure, and thereby these lower ends seize or engage the side edge of a respective plate-shaped object 2 as shown in FIG. 2. Plate-shaped objects 2 in the exemplified embodiment are circuit boards for electronic devices. The yoke 18 surrounds a rotatable guide rail 23 and is guided at its end 26 in this guide rail along the same. A portion 27 of the yoke 18 slides along a brush arrangement 29 which extends over the whole transporting area 28 (FIG. 1) and, during the transportation of objects 2, all the yokes 18 which engage the plate-shaped objects 2, are supplied with current of a suitable polarity by this brush arrangement 29.

Referring back to FIG. 1 it is seen that a great number of clamps or pairs of yokes 17, 18 are positioned one after the other and at the intervals from each other on an endless belt 31 running over rollers 30. The drive belt 31 also shown in FIG. 2 can be formed as a plastic tooth belt or a plastic chain whereby rollers 30 would have a respective toothing. The guide rail 21 is completely rotatable whereas a further rail 32 which has an onset or pushing surface 33 extends only over the non-transporting region of the clamps 17, 18, and also from the ends of the transporting area 28 over two drive rollers 30, and along the external strand 5 (FIG. 1) of the transporting belt 31. The respective internal strand 4 of the drive belt 31 extends in the transporting area 28. The onset surface 33 is positioned relative to an inclined end portion 34 of yoke 17 so that it pivots to the right in the plane of FIG. 2 due to the compression of springs 19 to such a position in which the ends 21, 22 of yokes 17, 18 are spaced from each other that is no clamping action onto the plate-shaped object 2 can be exerted. Thereby the plate-shaped objects are clamped by the clamps or yokes 17, 18 after they are inserted into the electrolytic bath 6 and are released from those clamps after the objects exit from bath 6. At the same time, the current is supplied during this process via yokes 18 to the plate-shaped objects 2.

The drive of guide rollers 30 is not shown and may be of any conventional suitable type. Springs 19 are supported between the arms 34 and 39 of the respective yokes 17 and 18, positioned above hinge axles 20. Thus a very simple and yet reliable structure for generating a clamping force between yoke ends 21 and 22 is provided. Both yokes may be formed so that they would not pivot about pivot axles or points 20 but the hinge connections 20 would be omitted while yoke 17 would be displaceable vertically relative to yoke 18 and tension spring for exerting the clamping force would be provided at the location designated at 19'. Such a tension spring would press the ends 21 and 26 of the yokes towards each other. The relative movement of the yoke ends when they leave the transporting area would be executed by a non-shown respectively formed onset surface 33 on rotary rail 32.

FIG. 2 further shows that transporting devices are preferably arranged so that all structural elements on which the sliding motions and thus the drive can occur are positioned laterally of the electrolytic bath. Thereby falling of the torn particles into the bath which particles could lead to incorrect locations of the metal deposited by the electrolysis is prevented. Such particles can occur between the yoke arms 39 and guide rail 23. In order to collect such particles a collecting plate or sheet 40 is provided, which forms above the of the liquid surface 7 of bath 6 and close to a demetallizing chamber 35, a collecting gutter or groove 41 for collecting the aforementioned particles.

During the electrolytic process, a respective metal inside the bath 6 is deposited on the yokes 17, 18. Yokes 17, 18 are provided at the locations above the ends 21, 22 up to the liquid surface 7 with a protective plastic sheating (not shown). However, in order to remove the deposited metal from the ends 21, 22 an additional bath chamber 35, which is a demetallizing chamber is provided. Bath chamber 35 is filled with an electrolytic liquid at the level 36 which can be below level or surface 7 of the electrolytic liquid in bath 6. As soon as yokes 17, 18 enter the bath 35 a current of a suitable polarity os supplied to them via an additional brush or wiper arrangement 37. This supplied current is of the polarity opposite to that supplied by the brush or wiper arrangement 29. Both wiper arrangements extend over the length of both strands 4, 5 of the drive belt 31. The opposite pole is formed by an element 38 which is inserted into the bath 35. The material deposited on ends 21, 22 of yokes 17, 18 is electrolytically removed from the latter during the passing of the yokes through the bath 35. Also a chemical demetallizing of the ends of the yokes is possible.

FIG. 1 shows the aforediscussed transport and current supply means can be provided at the left side and the at the right side of the electrolytic chamber 1, that is the plate-shaped objects 2 are engaged with the clamps at both sides. This is required when very thin plates (films) are to be treated. FIG. 2 in turn shows that the abovediscussed transport and current supply means can be positioned only at one side of the plate-shaped objects. Reference numerals 42 denote feeding tubes for electrolytic liquid.

It will be understood that each of the elements described above, or two or more together, may also find a useful application in other types of devices for the electroplating treatment of plate shaped objects differing from the types described above.

While the invention has been illustrated and described as embodied in a device for electroplating treatment of plateshaped objects, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for electrolytic deposition of a metal onto plate-shaped objects, comprising an electroplating bath filled with electrolytic liquid and admitting said objects for a certain period of time, said bath having an electroplating chamber to which the objects are continually fed in a horizontal position and from which they are discharged after an electrolytic treatment; anodes positioned in said chamber; means for applying current to said objects which serve as cathodes; and means for transporting said objects, said transporting means including at least one endless rotating belt and a plurality of transporting organs positioned on said belt and driven thereby in an endless row one after another, said transporting organs firmly holding side edges of the plate-shaped objects and moving in a transport direction over a transport path which is defined at a beginning and at an end of said chamber; and means effecting an engagement of said plate-shaped objects by said transporting organs and a release of said objects from said transporting organs.

2. The device as defined in claim 1, wherein said transporting organs are clamps which releasably engage the edges of said objects over said transport path in said chamber.

3. The device as defined in claim 2, wherein each clamp includes two yokes biased by springs supported therebetween, said springs exerting on said yokes a clamping force to place them in a clamping posrtion in which they seize an edge of an object being treated, said effecting means including a rail having an onset surface which acts on at least one of said yokes so as to bring said one yoke in a non-transporting region to a release position.

4. The device as defined in claim 3, wherein a guide rail is provided for guiding said yokes, said guide rail being endless and rotatable.

5. The devices as defined in claim 4, said yokes being positioned in pairs on said belt at intervals from each other.

6. The device as defined in claim 5, wherein a compression spring is provided for each yoke, each yoke being pivotable about a pivot connection and having an arm overlapping a respective spring which is positioned above a respective pivot connection and below said arm.

7. The device as defined in claim 6, wherein said current supply means are provided on said transport organs.

8. The device as defined in claim 7, wherein said current applying xeans includes a stationary wiper arrangement which lies on said yokes in the region of said transport path.

9. The device as defined in claim 8, further including an additional bath chamber filled with electrolytic liquid and positioned outside said transport path, and an additional stationary wiper arrangement applied to said yokes so as a current supplied to said yokes is of a polarity opposite to that of the yokes positioned in said transport path and applied by said wiper arrangement which lies on said yokes in the region of said transport path so as to demetallize the ends of said yokes.

10. The device as defined in claim 9, wherein said additional bath is filled with the electrolytic liquid which upon the transfer from or to said electroplating bath is applied to passing locations of said yokes to demetallize them.

11. The device as defined in claim 1, wherein said transporting means and current applying means are provided at at least one longitudinal side of each object to be treated.

12. The devices as defined in claim 1, wherein said transport means include two endless rotating belts for driving said transport organs, said belts being positioned laterally outside of said bath.

13. A device for electrolytic deposition of a metal onto circuit boards, comprising an electroplating bath filled with electrolytic liquid and admitting said objects for a certain period of time, said bath having an electroplating chamber to which the objects are continually fed in a horizontal position and from which they are discharged after an electrolytic treatment; anodes positioned in said chamber; means for applying current to said objects which serve as cathodes; and means for transporting said objects, said transporting means including at least one endless rotating belt and a plurality of transporting organs positioned on said belt and driven thereby in an endless row one after another, said transporting organs firmly holding side edges of the plate-shaped objects and moving in a transport direction over a transport path which is defined at a beginning and at an end of said chamber; and means effecting an engagement of said plate-shaped objects by said transporting organs and a release of said objects from said transporting organs.

* * * * *